(12) United States Patent
Raghunathan et al.

(10) Patent No.: US 12,278,269 B2
(45) Date of Patent: Apr. 15, 2025

(54) BIPOLAR TRANSISTOR WITH STEPPED EMITTER

(71) Applicant: GLOBALFOUNDRIES U.S. Inc., Malta, NY (US)

(72) Inventors: Uppili S. Raghunathan, Essex Junction, VT (US); Vibhor Jain, Williston, VT (US); Qizhi Liu, Lexington, MA (US); Yves T. Ngu, Williston, VT (US); Ajay Raman, Essex Junction, VT (US); Rajendran Krishnasamy, Essex Junction, VT (US); Alvin J. Joseph, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 361 days.

(21) Appl. No.: 17/852,966

(22) Filed: Jun. 29, 2022

(65) Prior Publication Data

US 2024/0006491 A1    Jan. 4, 2024

(51) Int. Cl.
*H01L 29/10*    (2006.01)
*H01L 29/08*    (2006.01)

(52) U.S. Cl.
CPC ...... *H01L 29/1095* (2013.01); *H01L 29/0804* (2013.01); *H01L 29/0821* (2013.01); *H01L 29/1004* (2013.01)

(58) Field of Classification Search
CPC ............ H01L 29/1095; H01L 29/0804; H01L 29/0821; H01L 29/1004; H01L 29/1008; H01L 29/0649; H01L 29/0657; H01L 29/0813; H01L 29/41708; H01L 29/66272; H01L 29/42304; H01L 29/732; H01L 29/7322–7327; H01L 29/7371–7375; H01L 27/0623; H01L 27/0262;
(Continued)

(56) References Cited

U.S. PATENT DOCUMENTS

| | | | | |
|---|---|---|---|---|
| 5,298,439 | A | * | 3/1994 | Liu ...................... H01L 29/0817 257/E29.189 |
| 5,668,388 | A | * | 9/1997 | Delage ................ H01L 29/0804 257/E29.189 |

(Continued)

FOREIGN PATENT DOCUMENTS

| | | | | |
|---|---|---|---|---|
| DE | 112012000615 | T5 * | 10/2013 | ........... H01L 29/045 |
| JP | H04179235 | | 6/1992 | |

(Continued)

OTHER PUBLICATIONS

Konstantinov, Bipolar transistor with overgrowth emitter, 2013, machine translation of DE 112012000615T5, pp. 1-22. (Year: 2013).*

(Continued)

*Primary Examiner* — Natalia A Gondarenko
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a bipolar transistor with a stepped emitter and methods of manufacture. The structure includes: a collector; a base over the collector; and an emitter over the base, the emitter comprising at least one stepped feature over the base.

20 Claims, 12 Drawing Sheets

(58) Field of Classification Search
CPC ............ H01L 27/0274; H01L 27/0277; H01L 29/6625; H01L 29/66265; H01L 29/66295–66303; H01L 29/66333–66348; H01L 29/66325; H01L 29/66234–66348; H01L 29/73–7378; H01L 29/739–7398; H01L 2924/1305–13056; H01L 27/0229–0244; H01L 27/082–0828; H01L 27/102; H01L 27/1022; H01L 27/11801; H01L 27/11896; H01L 27/2445
USPC ....... 257/370, 170, 197, 198, 200, 201, 586, 257/29.174, 21.632
See application file for complete search history.

(56) References Cited

U.S. PATENT DOCUMENTS

| | | | |
|---|---|---|---|
| 6,972,443 | B2 | 12/2005 | Khater |
| 7,598,148 | B1 | 10/2009 | Fields |
| 9,570,546 | B2 | 2/2017 | Vanhoucke et al. |
| 10,211,090 | B2 | 2/2019 | Stamper et al. |
| 2008/0203490 | A1* | 8/2008 | Feilchenfeld ....... H01L 29/7302 257/E29.174 |
| 2013/0020611 | A1 | 6/2013 | Gumaelius |
| 2020/0168705 | A1* | 5/2020 | Chao ................. H01L 29/41708 |
| 2020/0203508 | A1 | 6/2020 | Takashi |
| 2020/0251579 | A1* | 8/2020 | Obu ........................ H03F 3/213 |
| 2020/0259004 | A1 | 8/2020 | Tao et al. |

FOREIGN PATENT DOCUMENTS

| | | |
|---|---|---|
| JP | 2008218636 | 9/2008 |
| WO | 9834274 | 8/1998 |

OTHER PUBLICATIONS

Search Report in related EP Application No. 22198916.3-1212 dated Jun. 15, 2023, 11 pages.
Liu et al., "Research for SiGe HBT", IEEE, 2004, 4 pages.
Zampardi et al., "Transistor Design Considerations for Power Amplifier Applications", Skyworks, Mar. 3, 2010, 17 pages.
Chen et al., "Bipolar Microwave Linear Power Transistor Design", IEEE Transactions on Microwave Theory and Techniques, vol. 27, Issue 5, May 1979, 8 pages.

* cited by examiner

BIPOLAR TRANSISTOR WITH STEPPED EMITTER

BACKGROUND

The present disclosure relates to semiconductor structures and, more particularly, to a bipolar transistor with a stepped emitter and methods of manufacture.

Bipolar transistors can be vertical transistors or lateral transistors. Vertical bipolar transistors can be used for many different types of applications, e.g., ranging from high performance applications to high power and high breakdown applications. For example, bipolar transistors can be used in mm-wave power amplifiers and low noise amplifiers, automotive radars and optical interconnects.

Typically, vertical bipolar transistors, e.g., NPN, use large area transistors with wide emitter widths that suffer from poor emitter utilization (e.g., low junction capacitance at peak performance (Jcpk). This results from fringe currents in the emitter that follow the least resistive pathway to contacts across the periphery of the device, without going through the intrinsic (center) regions.

SUMMARY

In an aspect of the disclosure, a structure comprises: a collector; a base over the collector; and an emitter over the base, the emitter comprising at least one stepped feature over the base.

In an aspect of the disclosure, a structure comprises: a semiconductor substrate; a collector in the semiconductor substrate; shallow trench isolation structures isolating the collector in the substrate; a base comprising an intrinsic base over the collector and an extrinsic base adjacent to the intrinsic base; an emitter over the intrinsic base, the emitter comprising at least one raised mesa structure and a stepped feature on sides thereof; and a spacer separating the emitter from the base.

In an aspect of the disclosure, a method comprises: forming a collector; forming a base over the collector; and forming an emitter over the base, wherein the emitter comprises at least one stepped feature over the base.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a bipolar transistor with a stepped emitter and methods of manufacture. More specifically, the bipolar transistor may be a vertical NPN heterojunction bipolar transistor with a polysilicon emitter having one or more stepped features. Advantageously, the stepped emitter may provide improved emitter utilization for wider emitters, in addition to improved extrinsic Cbe (base to emitter capacitance) with a reduced emitter stack. Moreover, the use of the stepped emitter will have minimal impact to peak fT/fmax compared to reference design.

In more specific embodiments, the bipolar transistor includes a stepped emitter with one or more emitter contacts. In embodiments, the stepped emitter may be one or multiple steps on each side of the emitter contact. In further embodiments, the stepped emitter may have steps of different dimensions and/or configurations, and the emitter contact may be surrounded by smaller non-contacted emitter steps. In further embodiments, the stepped emitter feature may be covered with a dielectric material. Adding multiple, smaller emitter steps may be used to increase peripheral emitter resistance, cut emitter to base capacitance and improve the spread or direction of current flow through the intrinsic emitter (e.g., through the middle of the device). The emitter placement can also be used to minimize contact resistance.

The bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the bipolar transistors of the present disclosure have been adopted from integrated circuit (IC) technology. For example, the structures are built on wafers and are realized in films of material patterned by photolithographic processes on the top of a wafer. In particular, the fabrication of the bipolar transistors uses three basic building blocks: (i) deposition of thin films of material on a substrate, (ii) applying a patterned mask on top of the films by photolithographic imaging, and (iii) etching the films selectively to the mask. In addition, pre-cleaning processes may be used to clean etched surfaces of any contaminants, as is known in the art. Moreover, when necessary, rapid thermal anneal processes may be used to drive-in dopants or material layers as is known in the art.

Figure 1:
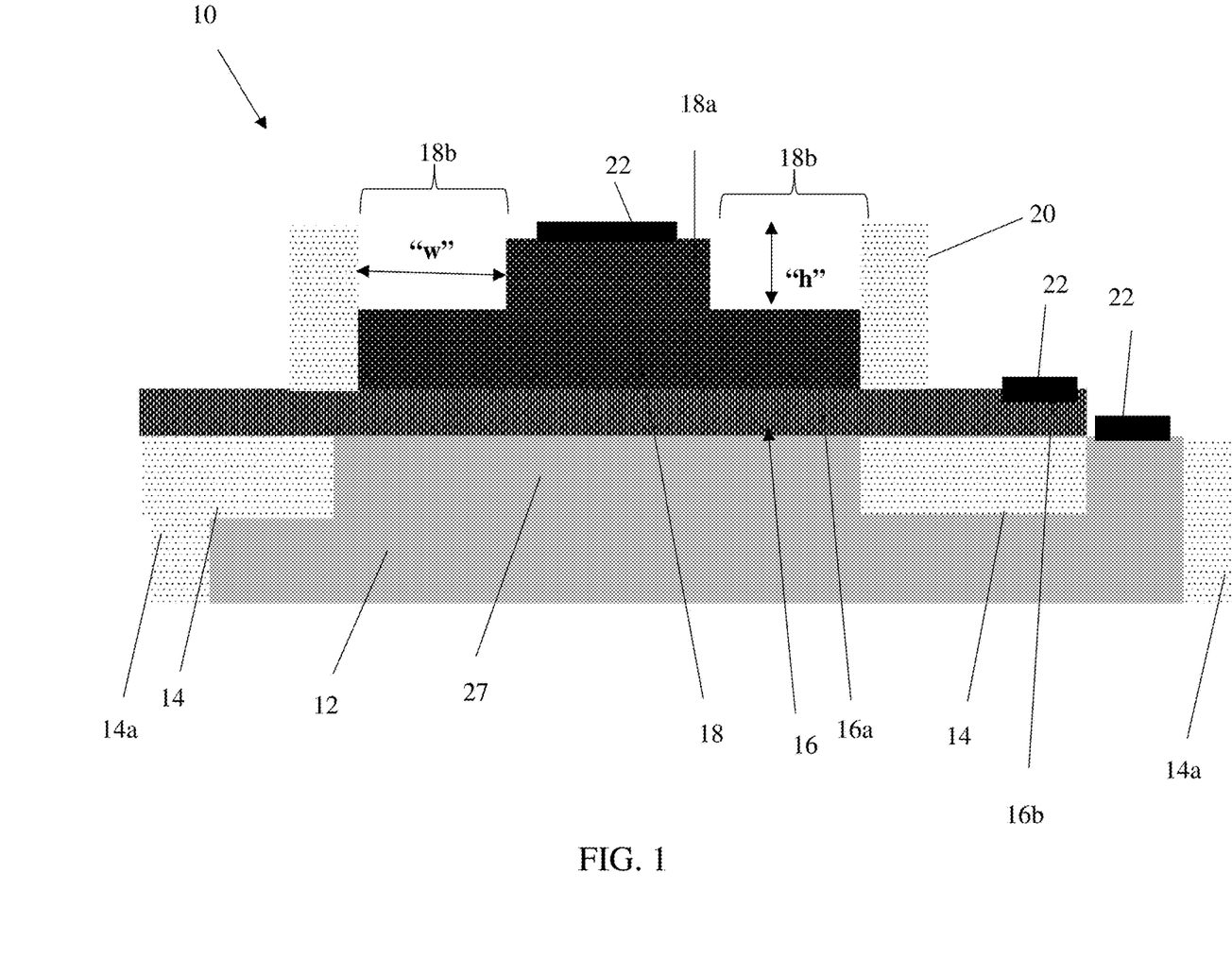
FIG. 1 shows a bipolar transistor with a stepped emitter in accordance with aspects of the present disclosure.

FIG. 1 shows a bipolar transistor with a stepped emitter in accordance with aspects of the present disclosure. More specifically, the structure 10 includes a substrate 12 comprising semiconductor material. In embodiments, the semiconductor substrate 12 may be composed of any suitable material including, but not limited to, Si, SiGe, SiGeC, SiC, GaAs, InAs, InP, and other III/V or II/VI compound semiconductors. In embodiments, the semiconductor substrate 12 may be a single crystalline semiconductor material with an N+ dopant type for a collector region of the bipolar transistor. In further embodiments, the semiconductor substrate 12 may be bulk semiconductor material or semiconductor on insulator technology.

Still referring to FIG. 1, shallow trench isolation structures 14 and deep trench isolation structures 14a may be formed in the substate 12, isolating the collector region 27. The shallow trench isolation structures 14 and deep trench isolation structures 14a may be, e.g., SiO$_2$. A base 16 may be provided over the semiconductor substrate 12 and the shallow trench isolation structures 14. In embodiments, the base 16 may be an intrinsic base 16a and an extrinsic base 16b. The base 16 may be any appropriate semiconductor material. For example, the base 16 may be SiGe, with the extrinsic base 16b being a polysilicon material as it is epitaxial grown on the shallow trench isolation structures 14 as described with respect to FIG. 9B. The base 16 is preferably doped with a P+ dopant, e.g., boron.

The emitter 18 may be formed over the base 16 and, preferably, the intrinsic base 16a. In embodiments, the emitter 18 comprises a stepped profile which includes a raised mesa (e.g., raised emitter region) 18a with a stepped feature 18b on the sides of the mesa 18a. As in each of the embodiments described herein, the emitter 18 comprises a single material (e.g., polysilicon) for the stepped feature 18b and the mesa 18a. The stepped feature 18b may be 10s-100s of nm thick, and surrounds a periphery of a silicide contact 22 provided on the mesa 18a of the emitter 18. In embodiments, the stepped feature 18b may extend to the underlying base 16, e.g., exposing the SiGe material. Silicide contacts 22 may also be provided on the base 16, e.g., extrinsic base 16b.

By way of non-limiting illustrative example, as in any of the embodiments, the emitter steps may vary in height "h" and width "w". For example, the width "w" may be about 15-80% of the emitter width. More specifically, the width "w" may be upwards of about 0.7 μm depending on the width of the emitter 18. The height "h" may be about 15-85% the total height of the emitter 18 and, preferably, about 30% of the total height of the emitter 18. More specifically, the height "h" may be about 25 nm to 150 nm depending on the height and/or doping concentration of the emitter 18.

The emitter 18 may be Si or polysilicon, deposited directly onto the base 16. In embodiments, the emitter 18 may be N+ doped (e.g., arsenic or phosphorous) semiconductor material. A spacer 20 separates the emitter 18 from the base 16, e.g., extrinsic base 16b. In embodiments and as illustrative examples, the spacer 20 may be oxide, nitride or a combination thereof which provides junction and terminal isolation between the base 16 and the emitter 18. In further embodiments, the emitter 18 and, more specifically, the stepped feature 18b may be covered with any dielectric material, e.g., oxide or nitride.

Figure 2:
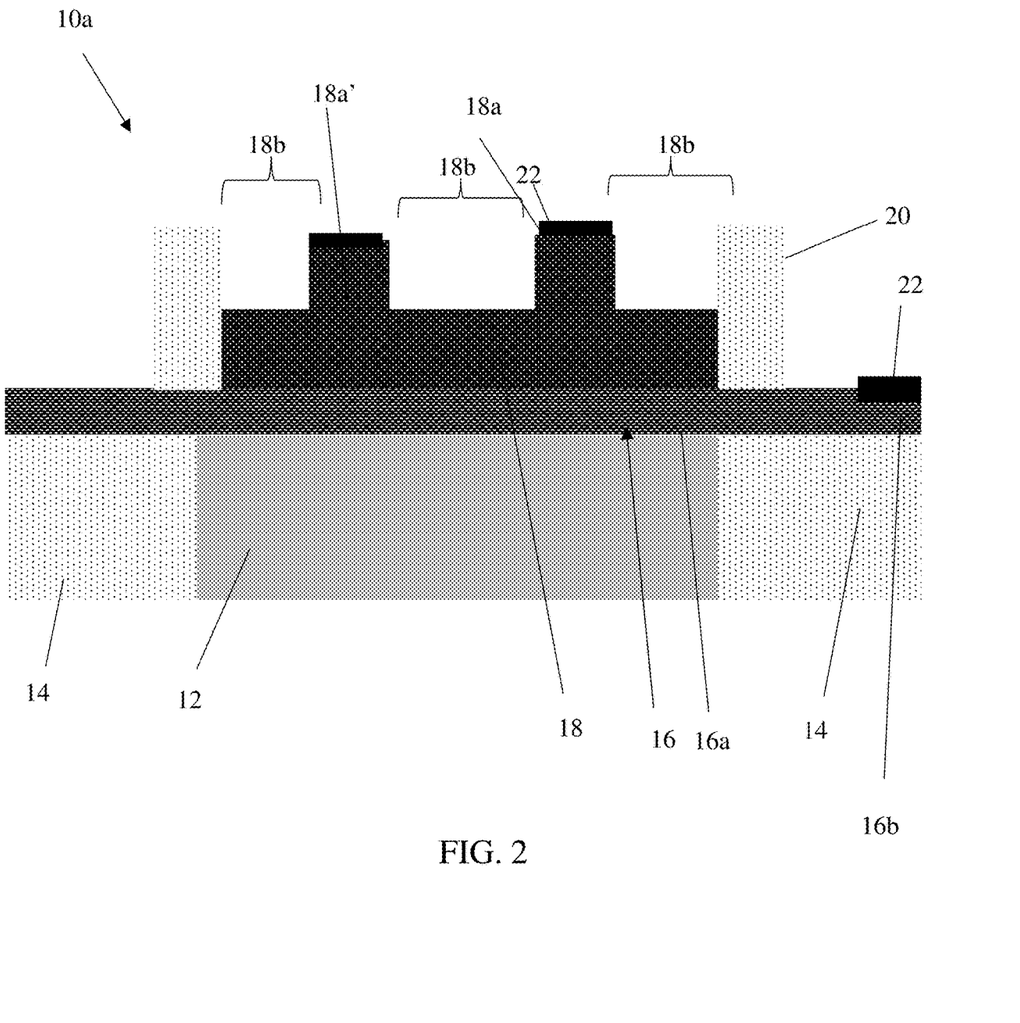
FIG. 2 shows a bipolar transistor with a multi-stepped emitter in accordance with aspects of the present disclosure.

FIG. 2 shows a bipolar transistor with a multi-stepped emitter in accordance with aspects of the present disclosure. More specifically, the structure 10a includes a substrate 12 comprising semiconductor material as noted above. A base 16, e.g., intrinsic base 16a and extrinsic base 16b, may be provided over the semiconductor substrate 12 and shallow trench isolation structures 14. The emitter 18 may be formed over the base 16 and, preferably, comprises a multi-stepped profile comprising multiple mesas 18a, 18a' with respective stepped features 18b on the sides of the multiple mesas 18a, 18a'. The stepped features 18b may be 10s-100s of nm thick, and surround a periphery of a silicide contact 22 on the multiple mesas 18a, 18a' of the emitter 18. As in the structure 10 of FIG. 1, the stepped features 18b may extend to the underlying base 16, e.g., exposing the SiGe material.

In embodiments, silicide contacts 22 may be formed on one or both of the mesas 18a, 18a'. It should be understood by those of skill in the art that multiple emitter contacts may help reduce contact resistance and satisfy requirements for wider emitter transistors. The silicide contacts 22 may also be provided on the base 16, e.g., extrinsic base 16b, with the spacer 20 separating the emitter 18 from the base 16, e.g., extrinsic base 16b. The remaining features are similar to the structure 10 described with respect to FIG. 1.

Figure 3:
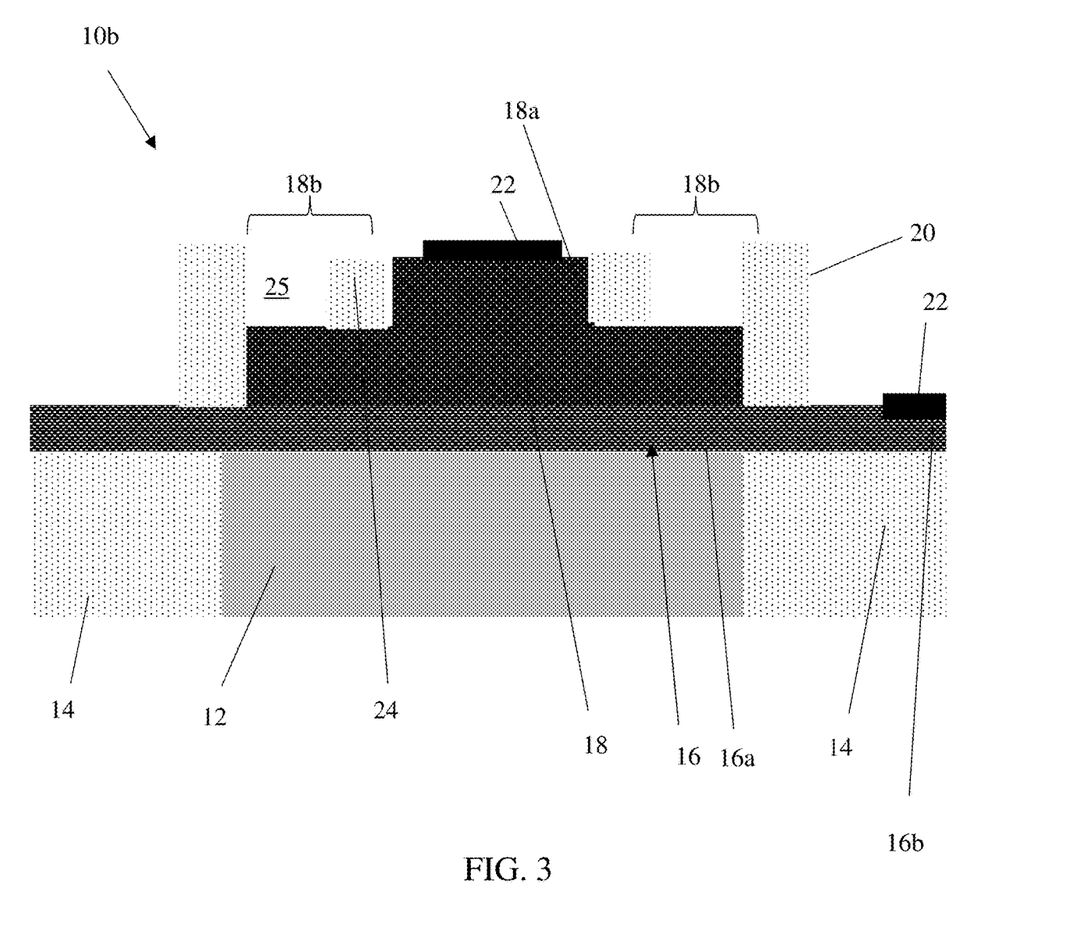
FIG. 3 shows a bipolar transistor with a stepped emitter in accordance with additional aspects of the present disclosure.

FIG. 3 shows a bipolar transistor with a stepped emitter in accordance with additional aspects of the present disclosure. In the structure 10b of FIG. 3, a spacer 24 is provided on sidewalls of the mesa 18a of the emitter 18. In this embodiment, a space 25 may be provided between the spacer 24 and the spacer 20, which can be filled with dielectric material. The remaining features are similar to the structure 10 described with respect to FIG. 1.

Figure 4:
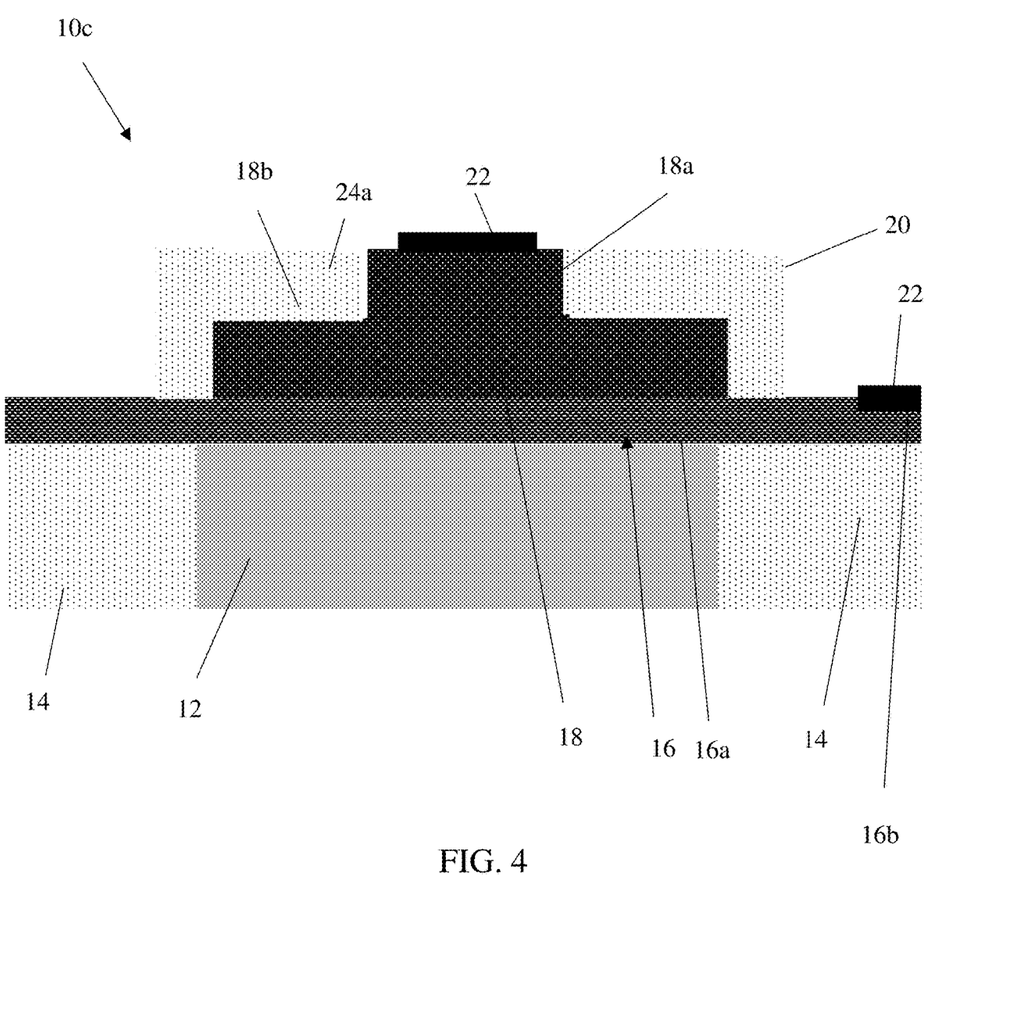
FIG. 4 shows a bipolar transistor with a stepped emitter in accordance with further aspects of the present disclosure.

FIG. 4 shows a bipolar transistor with a stepped emitter in accordance with further aspects of the present disclosure. In the structure 10c of FIG. 4, the spacer 24a on the sidewalls of the mesa 18a of the emitter 18 extends to and contact the spacer 20. The remaining features are similar to the structures described with respect to FIGS. 1 and 3.

Figure 5:
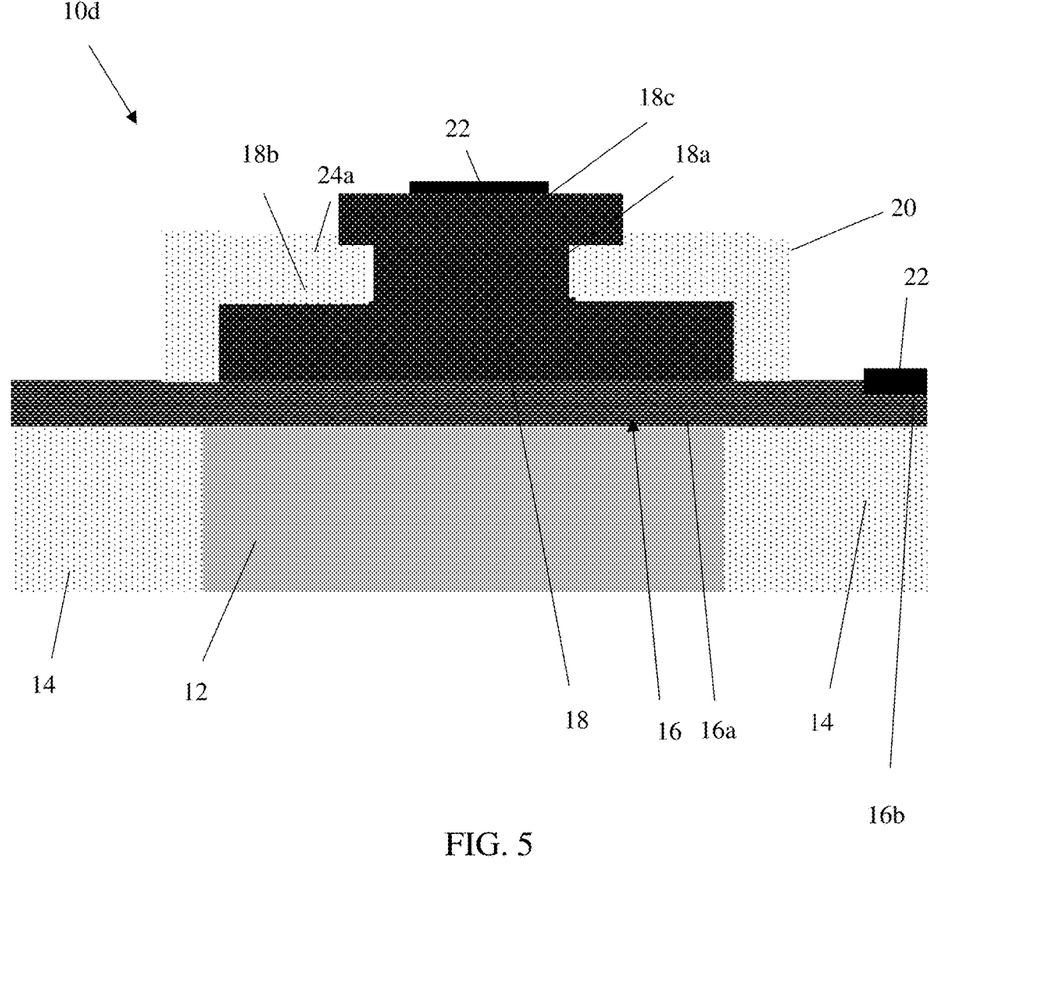
FIG. 5 shows a bipolar transistor with a stepped emitter in accordance with yet further aspects of the present disclosure.

FIG. 5 shows a bipolar transistor with a stepped emitter in accordance with yet further aspects of the present disclosure. In the structure 10d of FIG. 5, the emitter 18 may include an additional emitter mesa portion 18c that extends from the mesa 18a and onto a top surface of the spacer 24a. The additional emitter mesa portion 18c may be wider than the mesa 18a to help minimize contact resistance. The silicide contact 22 may be provided on the additional emitter mesa portion 18c. The remaining features are similar to the structure 10c described with respect to FIG. 4.

Figure 6:
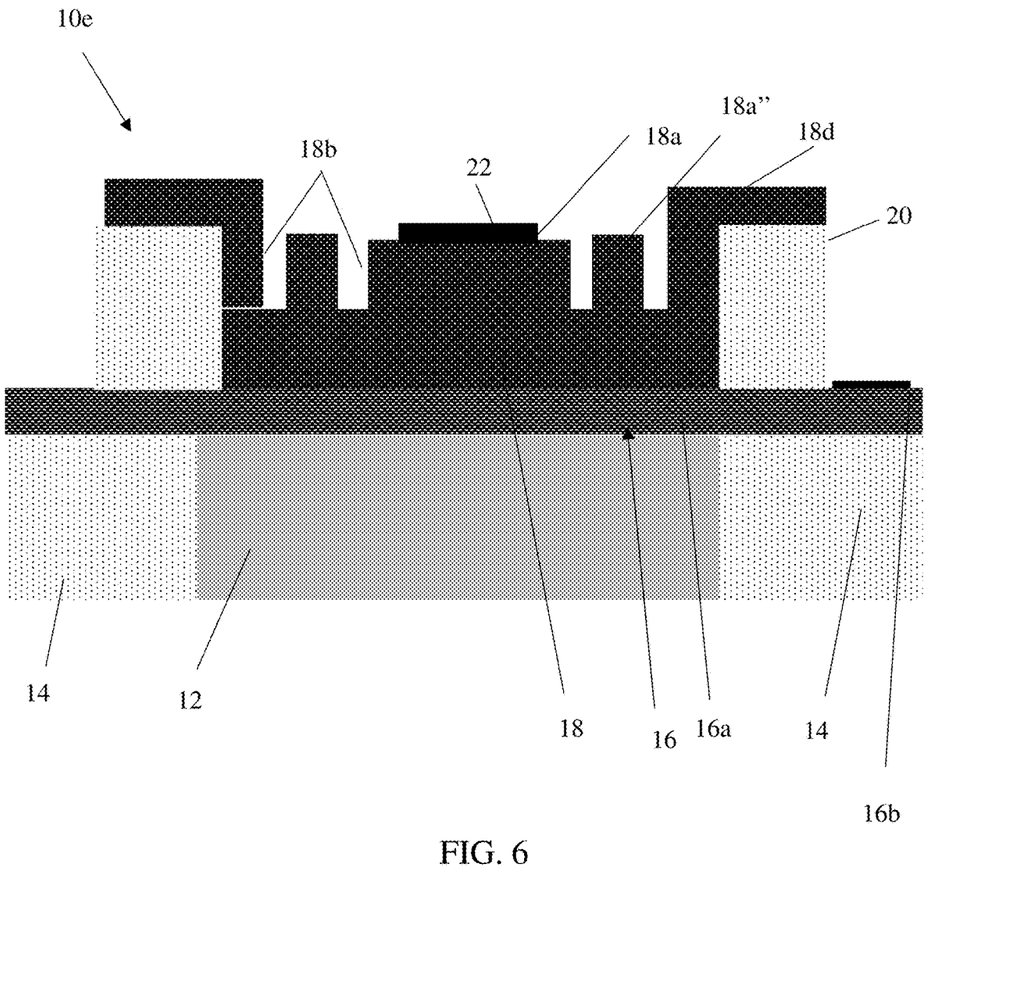
FIG. 6 shows a bipolar transistor with a multi-stepped emitter in accordance with aspects of the present disclosure.

FIG. 6 shows a bipolar transistor with a multi-stepped emitter in accordance with aspects of the present disclosure. More specifically, the structure 10e of FIG. 6 includes an emitter 18 with multiple mesas 18a, 18a". In this embodiment, a middle mesa 18a may be surrounded by two (or more) smaller mesas 18a" with respective stepped features 18b on the sides of the multiple mesas 18a, 18a". The small emitter mesas 18a" may force more current through the center of the device, with the current density profile "flattening" across the length of device. This configuration may improve the Jcpk as emitter width increases, compared to conventional emitter configurations.

In the embodiment of FIG. 6, the mesas 18a" may have the same dimensions, with the middle mesa 18a having the silicide contact 22. In this way, non-contacted mesas 18a" surround the contacted mesa 18a. In alternative embodiments, any of the mesas 18a, 18a" may include the silicide contacts 22. In addition, the emitter 18 may be on the sidewall and top surface of the spacer 20. The remaining features are similar to the structure 10 described with respect to FIG. 1.

Figure 7:
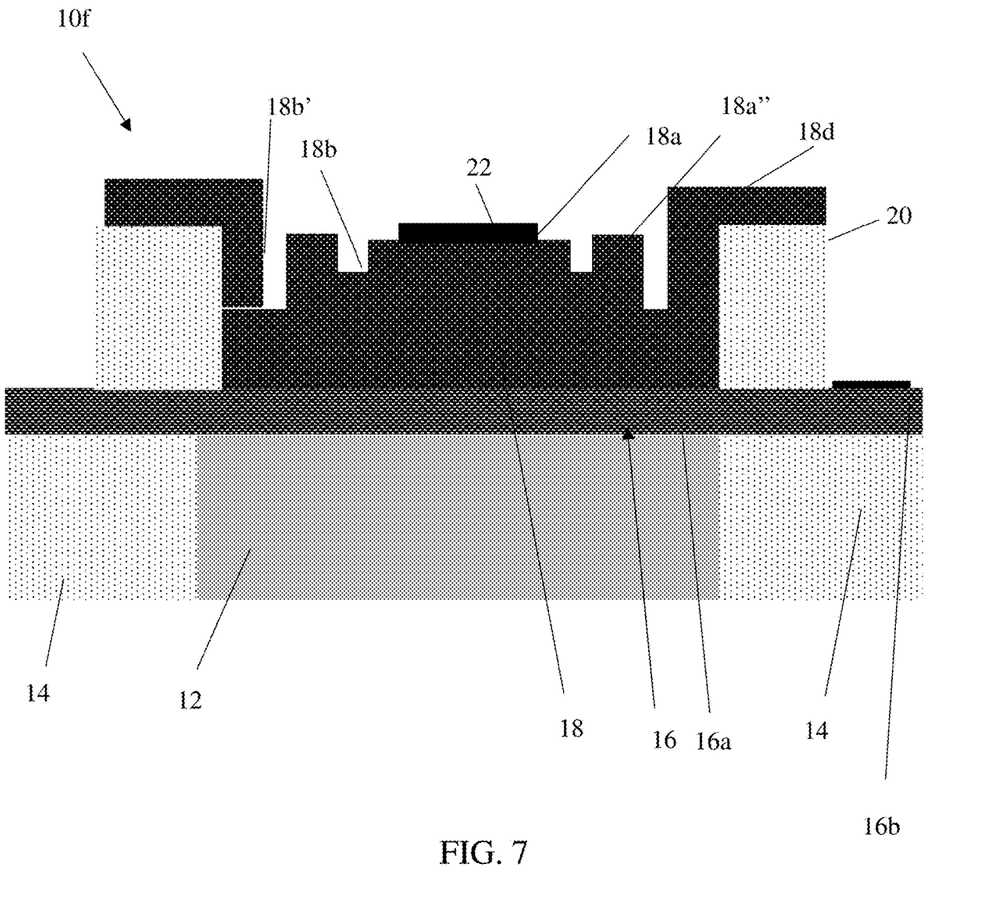
FIG. 7 shows a bipolar transistor with a multi-stepped emitter of different dimensions/configuration in accordance with additional aspects of the present disclosure.

FIG. 7 shows a bipolar transistor with a multi-stepped emitter in accordance with additional aspects of the present disclosure. More specifically, the structure 10f of FIG. 7 includes an emitter 18 with multiple mesas 18a, 18a" having different dimensions/configurations. In this embodiment, the stepped features 18b, 18b' may have different depths (e.g., or heights), with the middle mesa 18a having the silicide contact 22. As in any of the embodiments, multiple stepped features may be used to improve the directionality of current while the mesas improve heat conduction. The remaining features are similar to the structure 10e described with respect to FIG. 6.

FIGS. 8A-8D show different stepped patterns of the emitter in accordance with aspects of the present disclosure. As should be understood, the different stepped patterns (and/or configurations and/or dimensions) may be optimized differently for different emitter widths to ensure current flows into the middle of the device, e.g., middle of the intrinsic base and not only at the periphery.

Figure 8A:
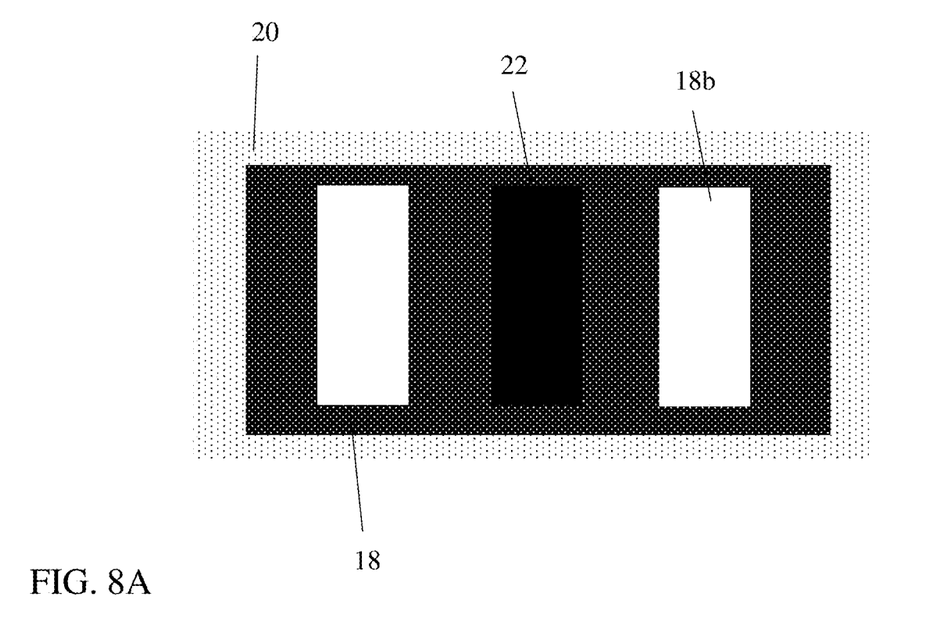
FIGS. 8A-8D show different stepped patterns of the emitter in accordance with additional aspects of the present disclosure.
Figure 8B:
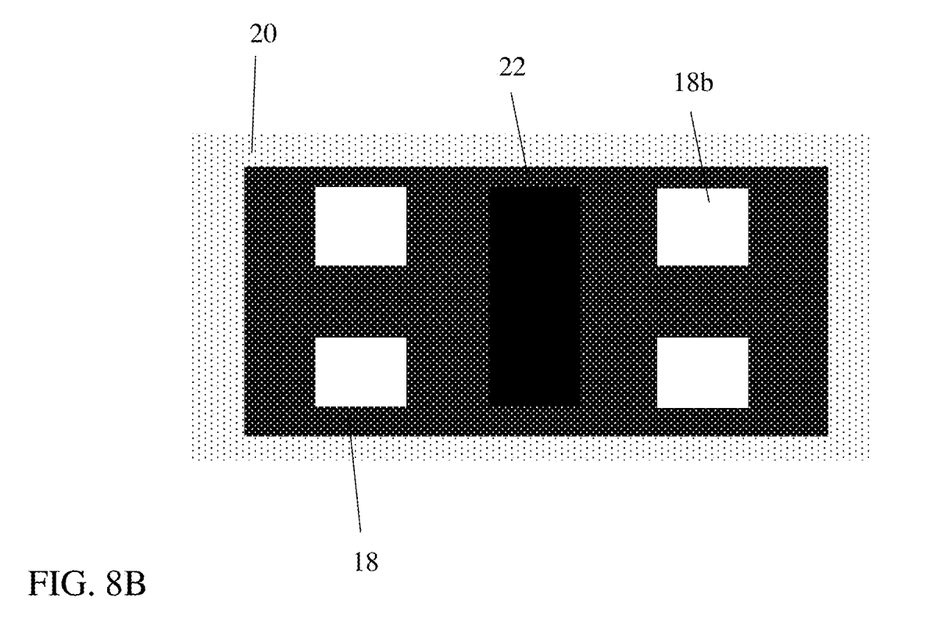
Figure 8C:
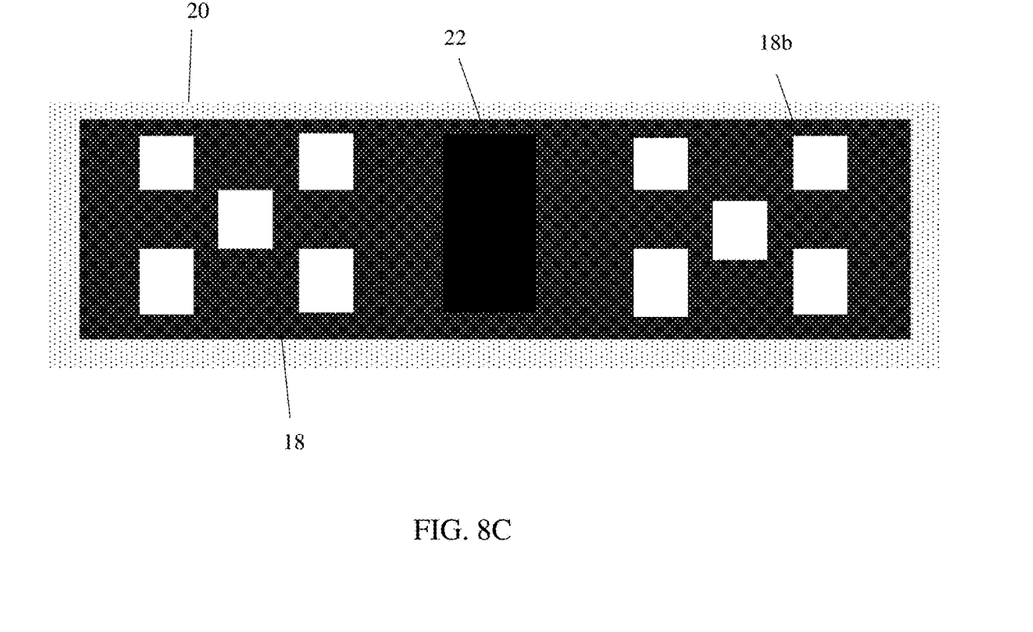
Figure 8D:
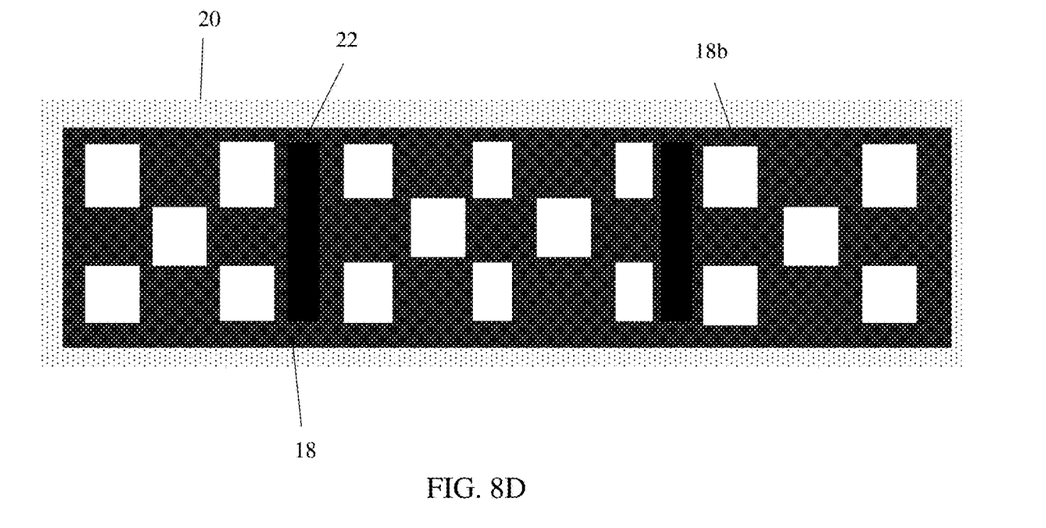

For example, in FIG. 8A, a single step 18*b* of approximately the same dimensions is provided on each side of the emitter contact 22 (e.g., silicide contact). In FIG. 8B, two disconnected steps 18*b* are provided on each side of the emitter contact 22 (e.g., silicide contact). In FIG. 8C, multiple (e.g., five) disconnected steps 18*b* are provided on each side of the emitter contact 22 (e.g., silicide contact). In this arrangement, some of the disconnected steps 18*b* may be offset from others of the disconnected steps in a checkerboard-type arrangement. In FIG. 8D, two emitter contacts 22 (e.g., silicide contact) are shown with multiple offset steps 18*b* in a checkerboard-type arrangement on each side of the emitter contacts 22.

FIGS. 9A-9D show process steps for fabricating the bipolar transistor 10 of FIG. 1 in accordance with aspects of the present disclosure. It should be recognized by those of skill in the art that similar fabrication processes can be used with different patterned masks to fabricate different mesa and stepped configurations of the emitter as shown in the remaining embodiments such that no further explanation is required for a complete understanding of the present disclosure.

Figure 9A:
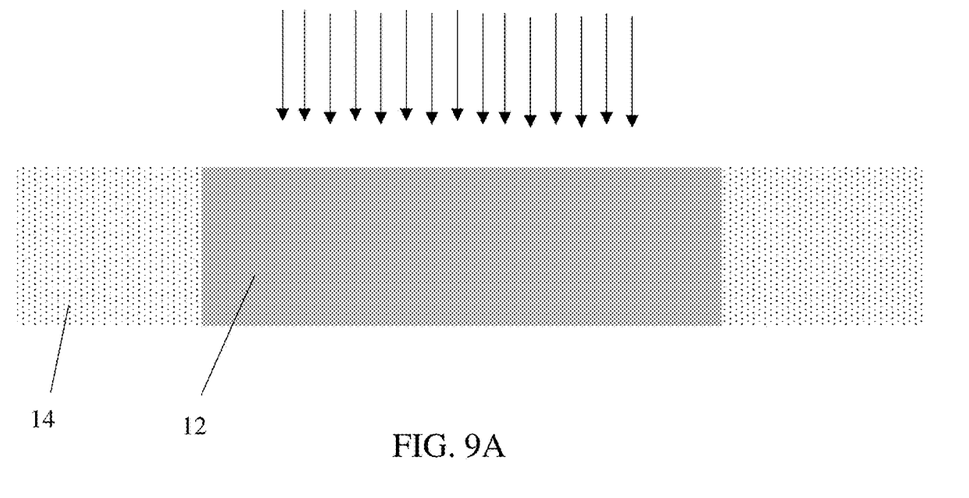
FIGS. 9A-9D show processing steps for fabricating the bipolar transistor of FIG. 1 in accordance with aspects of the present disclosure.
Figure 9B:
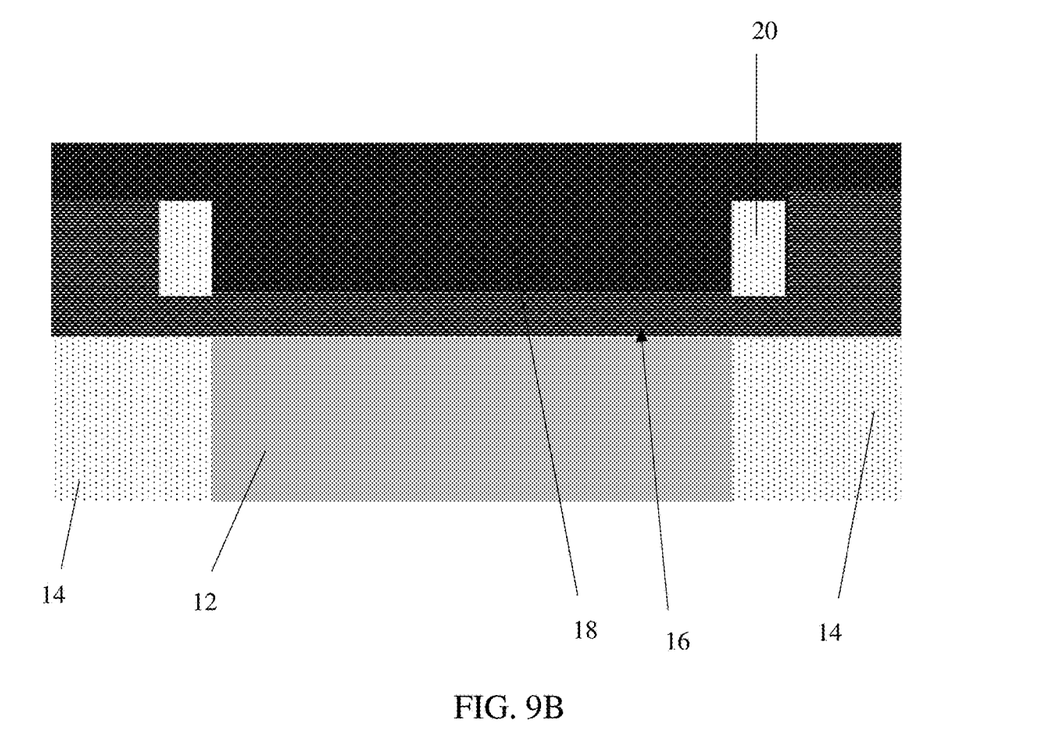

In FIG. 9A, shallow trench isolation structures 14 are formed in the semiconductor substrate 12. In embodiments, the shallow trench isolation structures 14 can be formed by conventional lithography, etching and deposition methods known to those of skill in the art. For example, a resist formed over the semiconductor substrate 12 is exposed to energy (light) and developed to form a pattern (opening). An etching process with a selective chemistry, e.g., reactive ion etching (RIE), will be used to transfer the pattern from the resist layer to the semiconductor substrate 12 to form one or more trenches in the semiconductor substrate 12. Following the resist removal by a conventional oxygen ashing process or other known stripants, the insulator material can be deposited by any conventional deposition processes, e.g., chemical vapor deposition (CVD) processes. Any residual material on the surface of the semiconductor substrate 12 can be removed by conventional chemical mechanical polishing (CMP) processes.

The semiconductor substrate 12 may be subjected to an ion implantation process to form a collector region. The collector region, for example, may be formed by introducing a concentration of an n-type dopant into the semiconductor substrate 12. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The collector region may be doped with n-type dopants, e.g., Arsenic (As), Phosphorus (P) and Sb, among other suitable examples In FIG. 9B, the base 16 may be epitaxially grown on the semiconductor substrate 12 and the shallow trench isolation structures 14. In embodiments, the base 16 may be single crystalline semiconductor material, e.g., SiGe material, over the collector region (exposed semiconductor substrate 12) and polysilicon material over the shallow trench isolation structures 14. The base 16 may be in-situ doped with a P+ type dopant, e.g., boron. A sidewall spacer 20 may be deposited and patterned (e.g., using an anisotropic etching process) on the base 16 as is known in the art such that no further explanation is required for a complete understanding of the present disclosure. The emitter 18 may be epitaxially grown on the base and sidewall spacer 20. In embodiments, the emitter 18 may be Si or polysilicon with an N+ dopant, e.g., arsenic or phosphorous. The dopant may be provided with an in-situ deposition process.

Figure 9C:
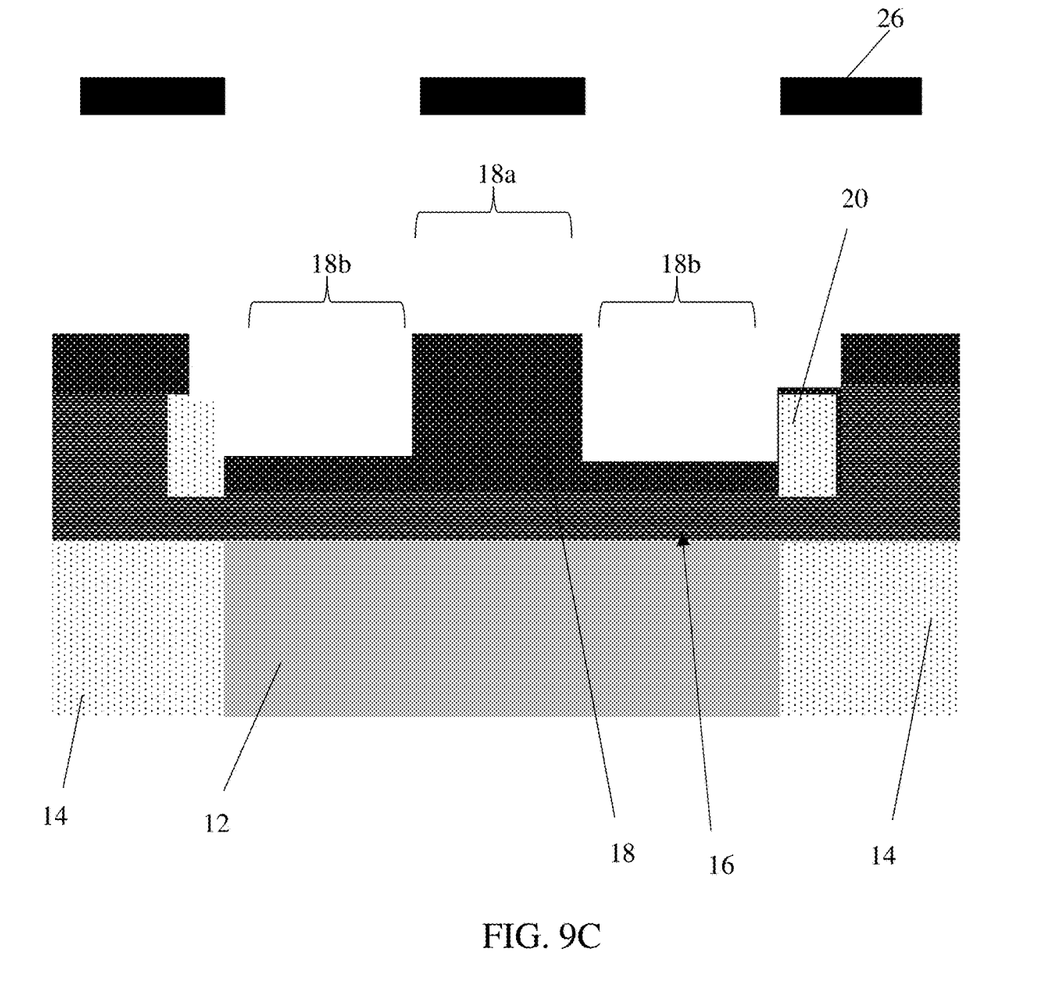

In FIG. 9C, the emitter 18 is patterned to form the mesa 18*a* and stepped features 18*b* using a patterned mask 26 which includes openings corresponding to the stepped features 18*b*. In embodiments, the patterning may comprise a timed etch process. In alternative embodiments, the emitter 18 may be a polysilicon material with a SiGe marker layer as an etch stop or endpoint detection. Alternatively, the emitter 18 may be a single crystalline semiconductor material followed by an emitter polysilicon material, where a thin interface oxide can be used as endpoint detection during etch or an etch stop during a wet chemical etch process.

Figure 9D:
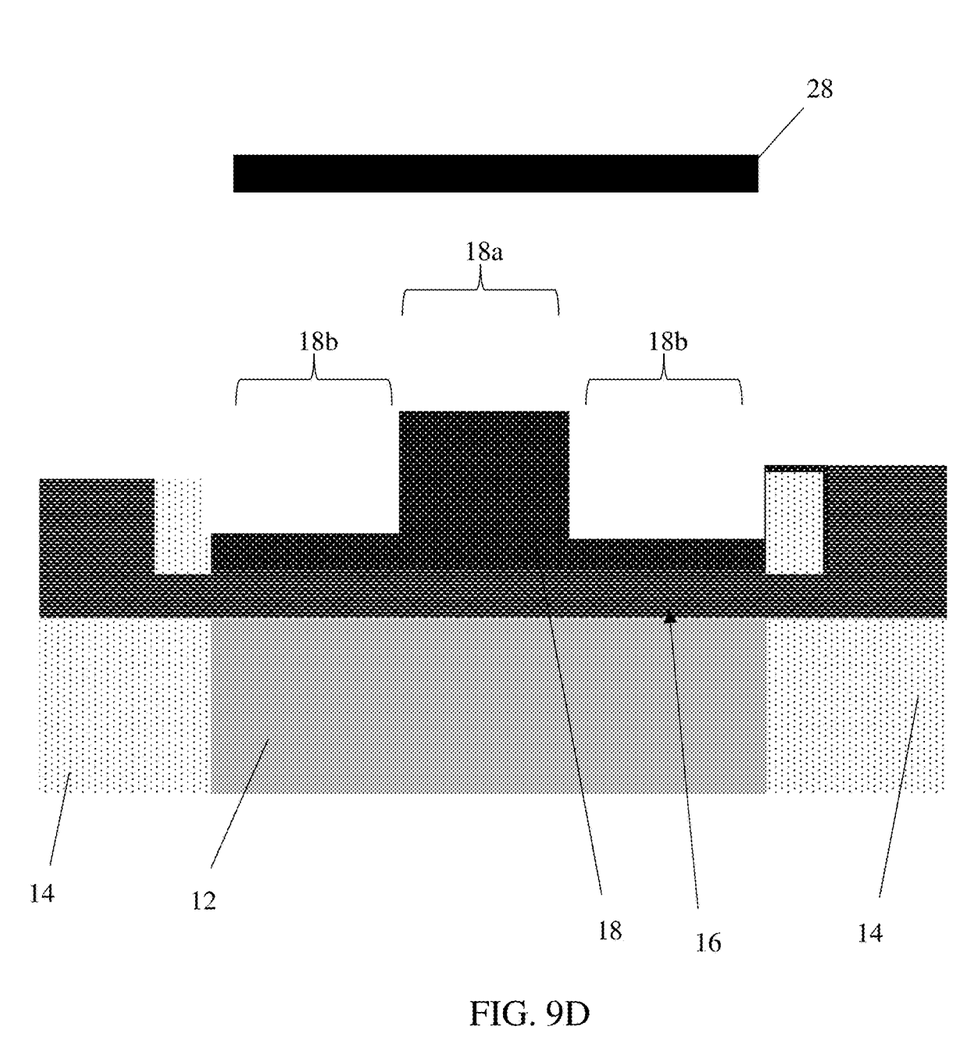

In FIG. 9D, the mask 26 may be removed by conventional stripants, followed by a new mask 28 to remove additional portions of the emitter material 18 over the base 16 and sidewall spacers 20. In alternative embodiments, the mask 26 may include additional openings to remove the additional portions of the emitter material 18 over the base 16 and sidewall spacers 20. Upon removal of the mask, a silicide process may be provided to form the silicide contacts 22 as shown in FIG. 1.

As should be understood by those of skill in the art, the silicide process begins with deposition of a thin transition metal layer, e.g., nickel, cobalt or titanium, over fully formed and patterned semiconductor devices, e.g., extrinsic base 16 and emitter 18. After deposition of the material, the structure is heated allowing the transition metal to react with exposed silicon (or other semiconductor material as described herein) in the active regions of the semiconductor device (e.g., extrinsic base 16 and emitter 18) forming a low-resistance transition metal silicide. Following the reaction, any remaining transition metal is removed by chemical etching, leaving silicide contacts 22 in the active regions of the device. An annealing process may be performed to drive in dopants into the semiconductor materials.

The bipolar transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a collector;
a base over the collector;
an emitter over the base, the emitter comprising at least one stepped feature over the base, wherein the at least one stepped feature comprises a first raised mesa with a first width dimension and a second raised mesa over the first raised mesa and with a second width dimension smaller than the first width dimension of the first raised mesa; and
a sidewall spacer on sidewalls of the first raised mesa, the sidewall spacer having a height extending to a height of the second raised mesa and the sidewall spacer being remote from a sidewall of the second mesa.

2. The structure of claim 1, wherein the base comprises an intrinsic base and an extrinsic base, and the at least one stepped feature is over the intrinsic base.

3. The structure of claim 1, further comprising a contact on the raised mesa with the stepped feature surrounding the contact.

4. The structure of claim 1, wherein the sidewall spacer separates the base from the emitter and further comprising a spacer on sidewalls of the second raised mesa.

5. The structure of claim 4, wherein the spacer extends over the stepped feature and contacts the sidewall spacer.

6. The structure of claim 5, further comprising an additional mesa structure on the spacer, the additional mesa comprising a width larger than the raised mesa.

7. The structure of claim 1, wherein the stepped feature comprises multiple raised mesas with multiple stepped features.

8. The structure of claim 7, further comprising a contact on each of the multiple raised mesas with the stepped feature surrounding the contact.

9. The structure of claim 7, further comprising a contact on one of the multiple raised mesas with the stepped feature surrounding the contact.

10. The structure of claim 7, wherein the multiple raised mesas comprise different configurations.

11. The structure of claim 1, wherein the stepped feature comprises multiple stepped features with some at least having different depths.

12. A structure comprising:
a semiconductor substrate;
a collector in the semiconductor substrate;
shallow trench isolation structures isolating the collector;
a base comprising an intrinsic base over the collector and an extrinsic base adjacent to the intrinsic base;
an emitter over the intrinsic base, the emitter comprising at least one raised mesa structure comprising lower mesa and at least one upper mesa and a stepped feature on sides therebetween, the lower mesa comprising a width dimension that is large than a width dimension of the at least one upper mesa; and
a spacer separating the emitter from the base and being provided only on sidewalls of the lower mesa and being remote from a sidewall of the upper mesa.

13. The structure of claim 12, further comprising a contact to the at least one raised mesa structure.

14. The structure of claim 12, wherein the at least one raised mesa structure comprises plural raised mesa structures with a contact to each of the plural raised mesa structures.

15. The structure of claim 12, wherein the at least one raised mesa structure comprises plural raised mesa structures with a contact to one of the plural raised mesa structures.

16. The structure of claim 12, wherein the stepped feature comprises multiple stepped features.

17. The structure of claim 16, wherein the multiple stepped features comprise different depths.

18. The structure of claim 12, further comprising a sidewall spacer on sidewalls of the at least one raised mesa structure.

19. A method comprising:
forming a collector;
forming a base over the collector;
forming an emitter over the base, the emitter comprising at least one stepped feature over the base, wherein the at least one stepped feature comprises a first raised mesa with a first width dimension and a second raised mesa over the first raised mesa and with a second width dimension smaller than the first width dimension of the first raised mesa; and
forming a sidewall spacer on sidewalls of the first raised mesa, the sidewall spacer having a height extending to a height of the second raised mesa and the sidewall spacer being remote from a sidewall of the second mesa.

20. The structure of claim 1, wherein the at least one stepped feature further comprises a wing structure extending over the sidewall spacer and upward extending protrusions.

* * * * *